United States Patent [19]

Ezura et al.

[11] Patent Number: 4,715,823
[45] Date of Patent: Dec. 29, 1987

[54] PLUG-IN SOCKET ASSEMBLY FOR INTEGRATED CIRCUIT PACKAGE

[75] Inventors: Toyokazu Ezura; Fujio Katsumata; Kiyokazu Ikeya, all of Shizuoka, Japan

[73] Assignee: Texas Instruments Incorporated, Dallas, Tex.

[21] Appl. No.: 934,063

[22] Filed: Nov. 21, 1986

[30] Foreign Application Priority Data

Dec. 31, 1985 [JP] Japan ............................. 60-299100

[51] Int. Cl.$^4$ ............................................. H01R 9/09
[52] U.S. Cl. ..................................... 439/267; 439/70; 439/269
[58] Field of Search ............ 339/17 CF, 74 R, 75 M, 339/75 MP; 439/68–73, 263–264, 266–270, 330

[56] References Cited

U.S. PATENT DOCUMENTS

| | | | |
|---|---|---|---|
| 4,491,377 | 1/1985 | Pfaff | 339/17 CF |
| 4,498,047 | 2/1985 | Hexamer et al. | 339/17 CF |
| 4,533,192 | 8/1985 | Kelley | 339/74 R |
| 4,623,208 | 11/1986 | Kerul et al. | 339/74 R |
| 4,630,875 | 12/1986 | Korsunsky et al. | 339/74 R |
| 4,645,279 | 2/1987 | Grabbe et al. | 339/17 CF |

Primary Examiner—John McQuade
Attorney, Agent, or Firm—John A. Haug; James P. McAndrews; Melvin Sharp

[57] ABSTRACT

A Plug-in socket assembly for use with a semiconductor integrated circuit package has a plurality of contact elements mounted on a support member. The contact elements are each formed with a spring portion, an elongated arm portion merging out of the spring portion to an inner lug portion engageable with a contact pin of the integrated circuit package and an outer lug portion in engagement with a housing member movable downwardly toward and upwardly away from the support member. The housing member is formed with an open space to receive the integrated circuit package therein and a carrier unit adapted to support the integrated circuit package is mounted on the support member and is movable relative to both the support and the housing members.

20 Claims, 11 Drawing Figures

PLUG-IN SOCKET ASSEMBLY FOR INTEGRATED CIRCUIT PACKAGE

FIELD OF THE INVENTION

The present invention relates to a plug-in socket assembly for use as a receptacle for a semiconductor integrated circuit package unit.

BACKGROUND OF THE INVENTION

A plug-in socket assembly for a semiconductor integrated circuit package unit generally consists of a support member having a number of contact elements mounted thereon and a housing member detachably fitted to the support member. The housing member has defined therein a space within which the integrated circuit package unit is to be held in a predetermined position when the integrated circuit package unit is carried in the socket assembly. The contact elements on the support member are each in part received in parallel slots formed in the housing member and have curved spring portions leading to lug portions. These lug portions support the housing member and are movable with the curved spring portions of the contact elements elastically deformed in response to movement of the housing member. Forced movement of the housing member in one direction as caused by application of an external force to the housing member causes each of the contact elements to elastically deform with the lug portions of the contact element moved outwardly away from the space within the housing member. With the lug portions of each contact element thus moved away from the space, the integrated circuit package unit to be mounted in the socket assembly is allowed to move to the predetermined position within the space without interference with the lug portions of the contact elements. When the external force is removed the housing member moves in the opposite direction with the contact elements attempting to restore their initial condition with their lug portions moved back toward the space within the housing member due to the elasticity of each contact element. The lug portions of the contact elements are thus elastically forced against the contact pins of the integrated circuit package unit, which is therefore fixedly held in the correct position within the socket assembly, providing established electrical connection from each of the contact pins to, for example, a printed circuit board through each of the contact elements.

A problem is encountered in a prior-art plug-in socket assembly of this type in that the effective length and radius of curvature of the curved spring portion of the contact elements are inadequate and thus require a significantly large force when the spring portion is to be elastically deformed when the integrated circuit package unit is inserted into the socket assembly. The integrated circuit package unit inserted into the socket assembly is maintained in the predetermined position within the socket assembly simply by the force of the spring portion of the contact element which attempts to restore its initial condition. Such a force is inadequate for correctly holding the integrated circuit package unit in the predetermined position within the socket assembly throughout the period of time for which the socket assembly is in use with the integrated circuit package unit.

It is, accordingly, an important object of the present invention to provide an improved plug-in socket assembly which is easy to use in mounting a semiconductor integrated circuit package unit within the socket assembly and which is capable of holding the integrated circuit package unit in the correct position within the socket assembly once the integrated circuit package unit is inserted into the socket assembly.

It is another important object of the present invention to provide an improved plug-in socket assembly featuring, inter alia, a contact element which can be elastically deformed to produce a sufficient amount of displacement by application of a small external force to the socket assembly when a semiconductor integrated circuit package unit is inserted into the socket assembly.

It is yet another important object of the present invention to provide an improved plug-in socket assembly which is capable of holding a semiconductor integrated circuit package unit carried therein with an adequate force which enables the integrated circuit package unit to stay in the correct position within the socket assembly throughout the period of time for which the socket assembly is in use with the integrated circuit package unit.

SUMMARY OF THE INVENTION

In accordance with the present invention, there is provided a plug-in socket assembly for use with a semiconductor integrated circuit package unit having a plurality of contact pins arranged along at least one side of the integrated circuit package unit, the socket assembly having a first direction in which the integrated circuit package unit is to be placed into the socket assembly and a second direction opposite to the first direction, comprising (a) a support member, (b) a housing member movable toward the support member in the first direction and away from the support member in the second direction, the housing member defining an open space adapted to have the integrated circuit package unit accommodated therein, (c) a carrier member for having the integrated circuit package unit detachably supported thereon, the carrier member being movable with respect to each of the support member and the housing member in a first direction into and in a second direction out of a position in which the integrated circuit package unit supported thereon assumes a predetermined position within the open space with respect to the support member, (d) a plurality of contact elements supported on the support member and each extending in part in the support member, each of the contact elements having (i) a seat portion disposed on the support member, (ii) a spring portion leading from the seat portion and arcuately curved at least in part away from the open space laterally of the socket assembly, (iii) an elongated arm portion merging out of the spring portion toward the open space laterally of the socket assembly, (iv) an inner lug portion leading from the arm portion and engageable with one of the contact pins of the integrated circuit package unit when the integrated circuit package unit is in the predetermined position within the open space, and (v) an outer lug portion merging out of the arm portion and located outwardly of the inner lug portion laterally of the socket assembly.

BRIEF DESCRIPTION OF THE DRAWINGS

The drawbacks of a prior-art socket assembly for an integrated circuit package unit and the features and advantages of a socket assembly according to the present invention will be more clearly understood from the following description taken in conjunction with the accompanying drawings in which like reference numerals designate similar or corresponding members, elements and portion and in which.

DESCRIPTION OF THE PRIOR ART

Figure 1:
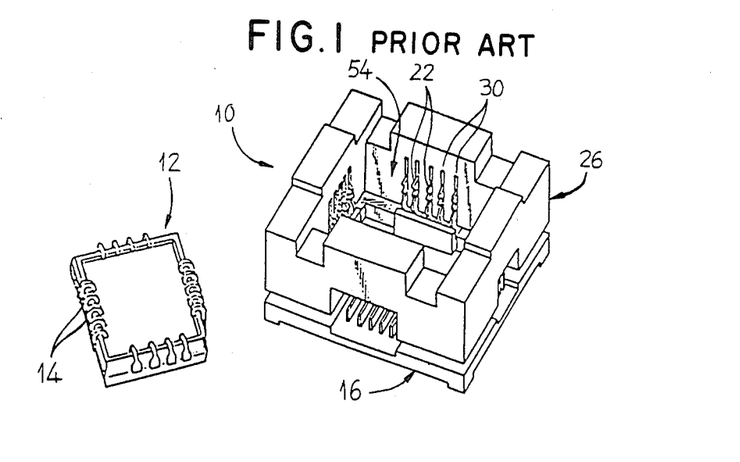
FIG. 1 is a prespective view showing a representative example of a prior-art plug-in socket assembly for use with a semiconductor integrated circuit package unit which is also herein shown in a prespective view.

In FIG. 1 is shown a typical example of a prior-art plug-in socket assembly 10 for use as a receptacle for a semiconductor integrated circuit package unit 12 to be tested within a reactor (not shown) for evaluating the heat resistance performance of the package unit 12. The integrated circuit package unit 12 is of a generally square-shaped design having a plurality of J-shaped contact pins 14 projecting from each side of the package unit 12.

Figure 2:
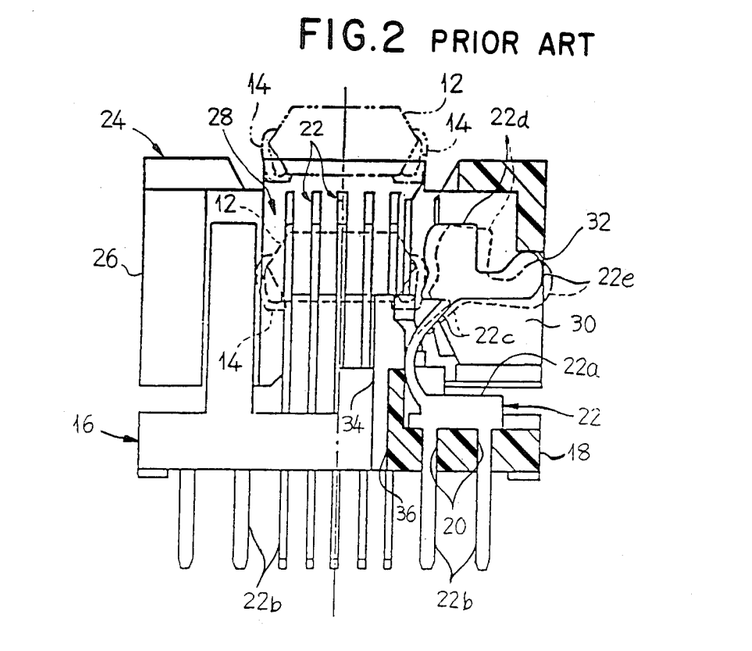
FIG. 2 is a sectional view taken on a vertical plane

As depicted in greater detail in FIG. 2, the known plug-in socket assembly 10 includes a lower support member 16 having a square-shaped base portion 18 formed with a number of apertures 20 arranged in an array along each of the four sides of the base portion 18. On the base portion 18 of the support member 16 are mounted a number of contact elements 22 each made from an elastic metal plate. Each of these contact elements 22 has a seat portion 22a received on the base portion 18 and lead portions 22b projecting from the seat portion 22a. The lead portions 22b extend downwardly through the apertures 20 in the base portion 18 for electrical connection to a suitable printed circuit board (not shown). The lead portions 22b serve not only for providing electrical connection to the printed circuit board but also as fixture means for having the contact element 22 fixed to the support member 16.

Each of the contact elements 22 further has a curved spring portion 22c upwardly merging out of the seat portion 22a and curved outwardly of the support member 16 above the seat portion 22a. The spring portion 22c merges into inner and outer lug portions 22d and 22e spaced apart from each other in a direction of length or width of the support member 16. These inner and outer lug portions 22d and 22e have upper ends at approximately equal heights above the base portion 18 of the support member 16, as shown. By elastic deformation of the curved spring portion 22c, these lug portions 22d and 22e are movable with respect to the support member 16 or, more exactly, rockable about a fulcrum point located at or adjacent the upper end of the spring portion 22c.

The prior-art plug-in socket assembly 10 further includes an upper housing member 24 having two pairs of side wall portions 26 and detachably fitted to the support member 16. The side wall portions 26 of the housing member 24 define a space 28 in the housing member 24 for accommodating the integrated circuit package unit 12 therein when the socket assembly 10 is used for testing purposes. Each of the side wall portions 26 of the housing member 24 is formed with a plurality of parallel slots 30 which are open to space 28 inwardly of the housing member 24 as will be better seen from FIG. 1. The contact elements 22 upstanding from the base portion 18 of the lower support member 16 are respectively received in these slots 30 with the lug portions 22d and 22e of each contact element 22 movable within the slot 30 in which the contact element is received. The housing member 24 has at the upper end of each of the slots 30 a lower end face 32 which defines the upper end of the slot 30. Each of the contact elements 22 is shaped such that the outer lug portion 22e of each contact element 22 is engageable with such an end face 32 of the slot 30 in which the contact element is in part received. Alongside each array of the contact elements 22 is provided a backup member 34 which is fixedly held in position with respect to the support member 16 with its lower portion securely fitted into an aperture 36 in the base portion 18 of the support member 16. The backup member 34 is located so that the spring portions 22c of the contact elements 22 are received at their turning ends on the outer face of the backup member 34 as shown.

The plug-in socket assembly 10 being thus constructed, the integrated circuit package unit 12 is mounted into and removed from the socket assembly 10 in the following manner.

Before the integrated circuit package unit 12 is placed into the socket assembly 10, the housing member 24 has its end faces 32 held in pressing contact with the outer lug portions 22e of the individual contact elements 22. The housing member 24 is thus supported by the contact elements 22 and is maintained in a position raised from the base portion 18 of the support member 16 by reason of the elasticity of the spring portions 22c of the contact elements 22. The inner and outer lug portions 22d and 22e of each of the contact elements 22 are maintained in positions indicated by full lines in FIG. 2 with respect to the support member 16, thus holding the housing member 24 in a condition ready to slightly move downwardly toward the base portion 18 of the support member 16. The integrated circuit package unit 12 to be inserted into the socket assembly 10 is at this stage positioned above the housing space 28 in the housing member 24 as indicated by dots-and-dash lines in FIG. 2.

The housing member 24 is then depressed downwardly by application of an external force to the housing member 24 to force the outer lug portions 22e of the contact elements 22 to move downwardly with respect to the support member 16 against the forces of the spring portions 22c. The lug portions 22e of the contact elements 22 being forced to move downwardly, the inner and outer lug portions 22d and 22e of each contact element 22 are caused to incline outwardly away from space 28 about the fulcrum point adjacent the upper end of the spring portion 22c as indicated by broken lines in FIG. 2. The integrated circuit package unit 12 which has been held in place above space 28 in the housing member 24 is now caused to move downwardly into space 28 without being interference with the inner lug portions 22d of the contact elements 22. The package unit 12 is thus moved to a position in the space 28 as indicated by broken lines in FIG. 2 and is surrounded by the respective inner lug portions 22d of the individual contact elements 22 arranged along the four sides of the housing member 24.

The external force which has been applied to the housing member 24 is then released to allow the housing member 24 to move upwardly to its initial position with respect to the support member 16. Due to the elasticity of the spring portion 22c of each contact element 22, the contact elements 22 now attempt to return to their initial condition with their inner and outer lug portions 22d and 22e moving back inwardly toward the housing space 28 in the housing member 24, viz., toward the positions indicated by the full lines in FIG. 2. The inner lug portions 22d of the contact elements 22 are forced against the contact pins 14, respectively, of the integrated circuit package unit 12, which is therefore fixedly held in a correct position within the socket assembly 10 as indicated by the broken lines in FIG. 2. The contact elements 12 being forcibly held in contact with the contact pins 14, respectively, of the integrated circuit package unit 12, electrical connection is established from each of the contact pins 14 to the printed circuit board through each of the contact elements 22. The integrated circuit package unit 12 thus installed within the socket assembly 10 can be removed therefrom when the integrated circuit package unit 12 is disengaged from the contact elements 22 with the housing member 24 depressed for a second time to force the lug portions 22d and 22e of the contact elements 22 outwardly away from the integrated circuit package unit 12 as indicated by the broken lines in FIG. 2.

Some problems are encountered in a prior-art plug-in socket assembly of this type. One of these problems is that the spring portion 22c of the contact element 22 has only a limited length and only a limited radius of curvature and requires a significantly large force when the portion 22c is to be elastically deformed when the integrated circuit package unit 12 is inserted into the socket assembly 10. Another important problem arises from the fact that the integrated circuit package unit 12 disposed in the socket assembly 10 is maintained in the predetermined position within the socket assembly 10 simply by the force of the spring portion 22d of the contact element 22 which attempt to return to their initial condition. Such a force is insufficient for correctly holding the integrated circuit package unit 12 in the predetermined position within the socket assembly 10 throughout the period of time for which the socket assembly 10 is to be maintained in a reactor during testing of the integrated circuit package unit 12. The goal of the present invention is to provide an improved plug-in socket assembly which is free from these problems which are inherent in the described prior-art socket assembly. Thus, the present invention contemplates the provision of a plug-in socket assembly which is easy to use in mounting a semiconductor integrated circuit package unit within the socket assembly and which is capable of holding the integrated circuit package unit in the correct position within the socket assembly once the integrated circuit package unit is inserted into the socket assembly as noted previously.

DESCRIPTION OF THE PREFERRED EMBODIMENTS

In the following description, some terms indicative of particular directions, such as the terms "upward" and "downward" as referred to in connection with various component members and elements of the embodiments shown are used merely for purposes of description with reference to the drawings. Such terms will therefore not dictate or limit the possible directions in which the members and elements may move or have with respect to other members or elements.

Referring to FIGS. 3 to 6, a plug-in socket assembly embodying the present invention is assumed, by way of example, to be basically of the same design as the prior-art socket assembly hereinbefore described with reference to FIGS. 1 and 2. The socket assembly, now designated in its entirety by reference numeral 40, is thus also intended for use as a receptacle for a semiconductor integrated circuit package unit 12 to be tested for evaluating the heat resistance performance of the integrated circuit package unit 12 within a reactor (not shown). The integrated circuit package unit 12 per se is assumed to be also similar to its counterpart shown in FIG. 1 and, thus, has a generally square-shaped overall configuration having a plurality of contact pins 14 projecting from each side of the package unit 12. Each of these contact pins 14 is assumed to extend generally in a J-shaped form, projecting from one end face of the integrated circuit package unit 12, then curved in an opposite direction along the side face of the package unit 12 and terminating in the vicinity of the edge of the other end face of the package unit 12 as will be best seen from FIG. 6.

Figure 3:
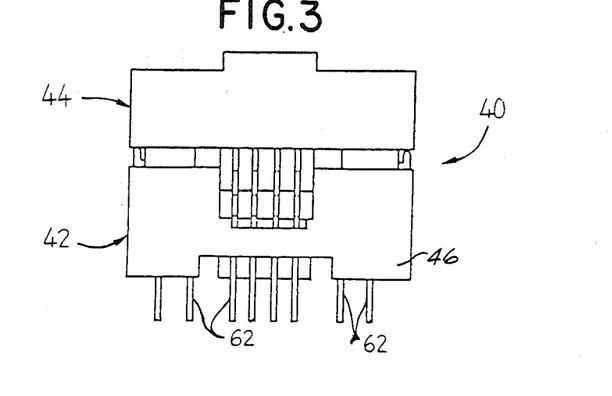
FIG. 3 is a side elevation view of a first preferred embodiment of a plug-in socket assembly according to the present invention.
Figure 4:
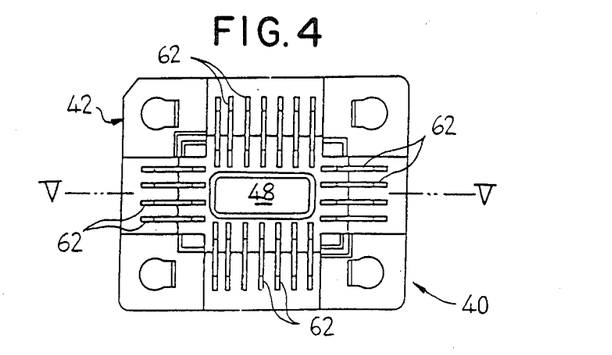
FIG. 4 is a top plan view of the embodiment illustrated in FIG. 3.
Figure 5:
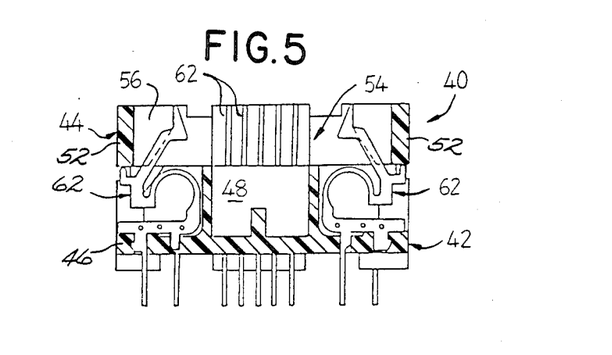
FIG. 5 is a sectional view taken along line V—V in FIG. 4.

As illustrated most simply in FIG. 3, the plug-in socket assembly 40 embodying the present invention comprises a lower support member 42 and an upper housing member 44 positioned above the support member 42. Each of these support and housing members 42 and 44 is constructed of a suitable refractory, electrically insulating material. The lower support member 42 has a generally rectangular base portion 46 and a generally rectangular, open-top trough section 48 located centrally of the base portion 46 as will be best seen from FIG. 4. The trough section 48 is formed by two pairs of parallel side wall portions, one pair of which is represented by 48a and 48b in FIG. 6. The base portion 46 of the support member 42 is formed with a number of apertures 50 arranged in an array along each of the four sides of the base portion 46 and accordingly along each of the four side wall portions of the trough section 48.

On the other hand, the upper housing member 44 has two pairs of side wall portions 52 detachably fitted to the support member 42. The side wall portions of the housing member 44 define a space 54 in the housing member 44 for accomodating the integrated circuit package unit 12 therein when the socket assembly 40 is used for testing purposes. Each of the side wall portions 52 of the housing member 44 is formed with a plurality of parallel vertical slots 56 which are open to space 54 inwardly of the housing member 44.

Figure 6:
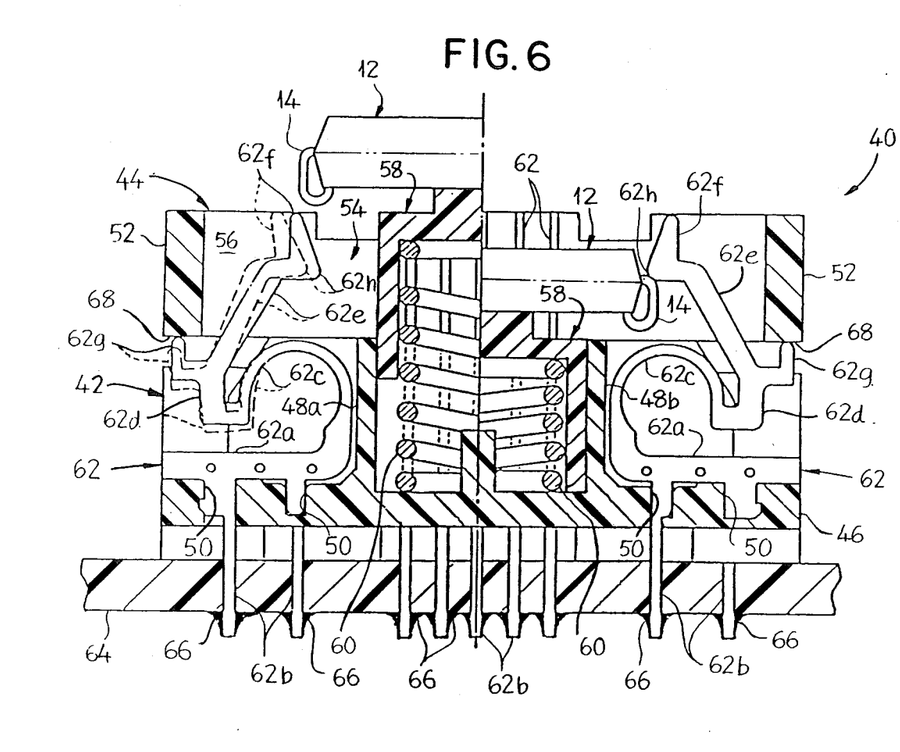
FIG. 6 is a view similar to FIG. 5 but shows the first preferred embodiment of the present invention in an enlarged scale, the right and left half sections of FIG. 6 respectively showing different conditions of the socket assembly.

A generally box-shaped open-bottom carrier member 58 having a closed upper end wall portion is fitted into the trough section 48 of the support member 42. The carrier member 58 is vertically slidable on the inner faces of the two pairs of side walls such as the side wall portions 48a and 48b of the trough section 48. The carrier member 58 is adapted to have the integrated circuit package unit 12 received thereon as illustrated in FIG. 6. Suitable biasing means is provided in association with the carrier member 58 to urge the carrier member 58 for upward movement with respect to the support member 42. In the embodiment herein shown, such biasing means comprises a coiled return spring 60 positioned within the trough section 48. The spring 60 is seated at one end on the base portion 46 of the support member 42 at the bottom of the trough section 48 and at the other end on the inner face of the closed upper end wall portion of the carrier member 58 as shown.

On the base portion 46 of the support member 42 are mounted a number of contact elements 62 each of which is made from an elastic or spring metal plate. Each of the contact elements 62 provided in the plug-in socket assembly 40 embodying the present invention has a seat portion 62a received on the base portion 46 and lead portions 62b projecting from the seat portion 62a. The seat portion 62a extends in a direction of length or width of the base portion 46 of the support member 42 and has an inner end adjacent the wall portion 48a or 48b of the trough section 48 of the support member 42 as shown. The lead portions 62b extend downwardly through the apertures 50 in the base portion 46 of the support member 42 and are soldered or otherwise secured at their lower ends to a printed circuit board 64 as indicated at 66 in FIG. 6. The lead portions 62b of the contact elements 62 serve not only for providing electrical connection to the printed circuit board 64 but also as fixture means for having the contact element 62 fixed to the support member 42. The contact elements 62 are arranged to be respectively aligned or otherwise associated with the individual contact pins 14 of the integrated circuit package unit 12 to be housed within the socket assembly 40.

Each of the contact elements 62 thus supported on the base portion 46 of the support member 42 further has a curved spring portion 62c merging out of the seat portion 62a at the inner end of the seat portion 62a. The spring portion 62c extends first straight upwardly from the inner end of the seat portion 62a and is then arcuately curved upwardly and outwardly of the support member 42 above the seat portion 62a. The spring portion 62c is curved preferably through a central angle of about 180 degrees or more above the seat portion 62a and has its leading end directed downwardly toward the seat portion 62a of the contact element 62 as shown. The spring portion 62c in turn merges into a relatively short, generally U-shaped intermediate portion 62d which extends above and generally parallel to the seat portion 62a and which forms part of a lever portion. The lever portion of the contact element 62 further comprises an elongated arm portion 62e extending from the intermediate portion 62d upwardly and inwardly of the support member 42 and terminating in an inner lug portion 62f. The lever portion of the contact element 62 further comprises an outer lug portion 62g which extends from the intermediate portion 62d outwardly and then upwardly of the support member 42 through a relatively short arm portion. The inner and outer lug portions 62f and 62g are spaced apart from each other in a direction of length or width of the support member 42 and have upper ends which are such that the upper end of the outer lug 62g is appropriately lower than that of the inner lug portion 62f as shown. Principally by the elastic deformation of the curved spring portion 62c, these lug portions 62f and 62g of each of the contact elements 62 are movable with respect to the support member 42 or, more exactly, rockable about an axis located in the curved spring portion 62c. The inner lug portion 62f of each contact element 62 has an inner face slanting upwardly and outwardly of the support member 42. It may be further noted that the arm portion 62e terminating in such an inner lug portion 62f extends away from the intermediate portion 62d in a direction approximately opposite to the direction in which the spring portion 62c merges into the intermediate portion 62d. The arm portions 62e of the contact elements 62 extend into the slots 56 in the housing member 44 and are respectively engageable with the J-shaped contact pins 14 of the integrated circuit package unit 12 when the package unit 12 is held in a predetermined position within the housing space 54 in the housing member 44 as will be described in more detail below.

The individual contact elements 62 upstanding from the base portion 46 of the lower support member 42 are thus respectively received in the slots 56 in the housing member 44 with the inner and outer lug portions 62f and 62g of each contact element 62 movable within the slot 56 in which the contact element is received. The side wall portions 52 of the housing member 44 have at the lower ends of the slots 56 lower end faces 68 which define the lower ends of the slots 56. Each of the contact elements 62 is shaped such that the outer lug portion 62g of each contact element 62 is engageable with such an end face 68 of a slot 56 in which the contact element is received. Furthermore, the side wall portions such as the wall portions 48a and 48b of the trough section 48 of the support member 42 are located so that the spring portions 62c of the contact elements 62 are in part engageable with the outer faces of the side wall portions.

With the plug-in socket assembly 40 embodying the present invention thus constructed, the integrated circuit package unit 12 is mounted into and removed from the socket assembly 40 in the following manner.

The integrated circuit package unit 12 to be placed into the socket assembly 40 is first mounted on the closed upper end wall portion of the carrier member 58 which is held in a raised position with respect to the support member 42 by means of the return spring 60 positioned within the trough providing an upward bias to carrier member 58. The integrated circuit package unit 12 is thus positioned above the housing space 54 in the housing member 44 with the leading ends of the contact pins 14 directed upwardly as indicated on the left half section of FIG. 6. Before the integrated circuit package unit 12 is placed into the socket assembly 40, the housing member 44 has its end faces 68 held in engagement with the outer lug portions 62g of the individual contact elements 62 provided in the socket assembly 40. The housing member 44 is thus supported by the contact elements 62 in weight transmitting relationship to the lug portions 62g of the contact elements 62 and is maintained in a position raised from the base portion 46 of the support member 42 by reason of the elasticity of the spring portions 62c of the contact elements 62. The inner and outer lug portions 62f and 62g of each of the contact elements 62 are maintained in positions indicated by full lines in FIG. 6 with respect to the support member 42, thus holding the housing member 44 in a condition ready to slightly move downwardly toward the base portion 46 of the support member 42.

The housing member 44 is then depressed downwardly by application of an adequate external force to the housing member 44. The outer lug portions 62g of the individual contact elements 62 are caused to move downwardly with respect to the support member 42 with the spring portions 62c of the contact elements 62 elastically deformed. The outer lug portions 62g of the individual contact elements 62 being thus forced to move downwardly, the inner and outer lug portions 62f and 62g of each contact element 62 are caused to incline outwardly away from the housing space 54 in the support member 42 about an axis located within the spring portion 60c as indicated by broken lines in FIG. 6. The integrated circuit package unit 12 mounted on the carrier member 58 is now caused to move downwardly into the housing space 54 with the carrier member 58 depressed deeper into the trough section 48 of the support member 42 against the force of the return spring 60 as indicated on the right half section of FIG. 6. With the inner lug portions 62f of the contact elements 62 having been moved outwardly away from the space 54, the integrated circuit package unit 12 on the carrier member 58 is allowed to enter the housing space 54 without interference with the inner lug portions 62f of the contact elements 62. The carrier member 58 is moved downwardly until the integrated circuit package unit 12 reaches a predetermined position in the space 54 as indicated on the right half section of FIG. 6. The integrated circuit package unit 12 moved to this position is surrounded by the respective inner lug portions 62f of the individual contact elements 62 arranged along the four sides of the housing member 44. It will be apparent that the movement of the integrated circuit package unit 12 to such a position is allowed with the inner lug portions 62f of the contact elements 62 already moved outwardly away from the housing space 54 in the housing member 62 by the elastic deformation of the spring portions 62c.

The external force which has been applied to the housing member 44 is then released to allow the housing member 44 to move upwardly to its initial position with respect to the support member 42 by the force of the return spring 60. Due to the elasticity of the spring portions 62c of each contact element 62, the contact elements 62 now attempt to return to their initial condition with their inner and outer lug portions 62f and 62g moving back inwardly toward space 54 in the housing member 44, viz., toward the positions indicated by the full lines in FIG. 6. It therefore follows that the inner faces of the inner lug portions 62f of the contact elements 62 are respectively forced against the contact pins 14 of the integrated circuit package unit 12, which is therefore fixedly held in the correct position within the socket assembly 40 as indicated on the right half section of FIG. 6. The contact elements 62 being forcibly held in contact with the individual contact pins 14, respectively, of the integrated circuit package unit 12, electrical connection is provided from each of the contact pins 14 to the printed circuit board 64 through each of the contact elements 62.

When the downward force which has been applied to the integrated circuit package unit 12 is thereafter removed from the package unit 12, the return spring 60 acting on the carrier member 58 will attempt to move the carrier member 58 upwardly with respect to the support member 42. The inner lug portion 62f of each of the contact elements 62 has a lower abutting surface portion 62h held in downwardly and inwardly pressing engagement with the upwardly directed leading end portion of the associated contact pin 14 of the integrated circuit package unit 12 as indicated on the right half section of FIG. 6. The integrated circuit package unit 12 is thus securely maintained in place within space 54 in the housing member 44 and reliably connected to the printed circuit board 64 with the force of the return spring 60 sufficiently overcome by the forces exerted on the package unit 12 from the contact elements 62. As noted previously, each of the contact elements 62 is characterized in that the elongated arm portion 62e extends away from the intermediate portion 62d in a direction approximately opposite to the direction in which the spring portion 62c merges into the intermediate portion 62d. The intermediate portion 62d per se of each contact element 62 therefore has a relatively large modulus of elasticity (Young's modulus) and is relatively resistive to deformation with respect to the intermediate portion 62d. The force which the return spring 60 exerts in an attempt to move the integrated circuit package unit 12 upwardly and outwardly of the housing space 54 is resisted by the intermediate portion 62d of each of the contact elements 62. Another reason for which the load distance provided by the arm portion 62e of each contact element 62 is far longer than the effort distance effective with the spring portion 62c attempting to expand and return to its initial condition. By reason of such relationship between the load and effort distances effective in each contact element 62, the force which the spring portion 62c of the contact element 62 exerts on the integrated circuit package unit 12 to urge the unit 12 inwardly into space 54 is amplified at the abutting surface portion 62h of the inner lug portion 62f, viz., at the load point of the contact element 62. Due to this amplified force along with the large modulus of elasticity as above mentioned, the integrated circuit package unit 12 is securely held in the correct position within the housing space 54 and can not be dislodged from such a position as long as the contact elements 62 are not forcibly deformed.

The integrated circuit package unit 12 thus installed within the socket assembly 40 can be removed from the carrier member 58 with the housing member 44 depressed downwardly to force the lug portions 62f and 62g of the contact elements 62 to move outwardly away from the integrated circuit package unit 12 as indicated by the broken lines in FIG. 6. The inner lug portions 62f of the contact elements 62 being thus disengaged from the integrated circuit package unit 12, the carrier member 58 is permitted to move upwardly with respect to the support member 42 by the force of the return spring 60 so that the integrated circuit package unit 12 on the carrier member 58 is allowed to reach the initial position indicated on the left half section of FIG. 6. The integrated circuit package unit 12 may be removed from the carrier member 58 either mechanically or by means of vacuum.

Figures 7, 8:
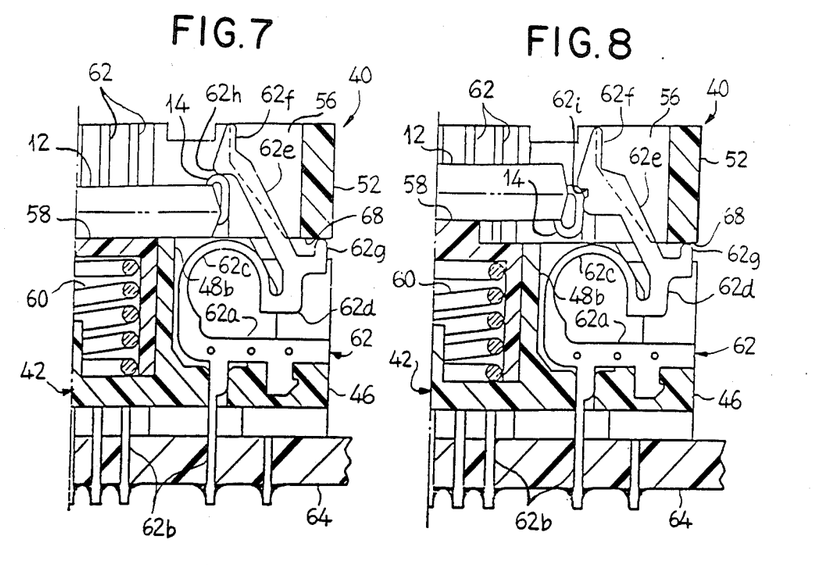
FIG. 7 is a fragmentary sectional view showing part of the arrangement in which the first preferred embodiment of the present invention is used with the integrated circuit package unit positioned upside down.
FIG. 8 is a fragmentary sectional view showing a second preferred embodiment of a socket assembly according to the present invention.

It has been assumed that the plug-in socket assembly 40 embodying the present invention is used for the testing of the heat resistance performance of the elements located on one side of the integrated circuit package unit 12. In this instance, the inner lug portion 62f of each contact element 62 has its lower abutting surface portion 62h held in pressing engagement with the associated contact pin 14 of the integrated circuit package unit 12 at the leading end of the pin 14 as indicated on the right half section of FIG. 6. The socket assembly 40 embodying the present invention is however operable also for the testing of the heat resistance performance of the elements located on the reverse side of the integrated circuit package unit 12. FIG. 7 shows an example of the arrangement in which the socket assembly 40 is used for such purpose. The integrated circuit package unit 12 is shown positioned upside down on the carrier member 58 with the leading end portions of the contact pins 14 directed downwardly so that the inner lug portion 62f of each contact element 62 has its lower abutting surface portion 62h held in pressing engagement with the associated contact pin 14 of the integrated circuit package unit 12 at the upper turning portion of the pin 14. Thus, the inner lug portion 62f of each of the contact elements 62 is shaped to be closely engageable with each of the turning and end portions of the contact pin 14 of the integrated circuit package unit which has the turning portion portion close to one of its end faces and the end portion close to the other of the end faces.

The embodiment of a plug-in socket assembly according to the present invention as hereinbefore described and shown may be modified in many ways if desired.

FIG. 8 shows a modification of the embodiment of FIGS. 3 to 6, wherein the inner lug portion 62f of each of the contact elements 62 is formed with a recess or cutout 62i. With the recess 62i thus formed in the inner lug portion 62f, the lug portion 62f of each contact element 62 has two, upper and lower, abutting surface portions which are vertically spaced apart from each other across the recess 62i. These two abutting surface portions are shaped so that the upper abutting surface portion of the inner lug portion 62f is engageable downwardly with the associated contact pin 14 of the integrated circuit package unit 12 while the lower abutting surface portion of the inner lug portion 62f is engageable laterally inwardly with the contact pin 14. The integrated circuit package unit 12 can thus be retained in position within space 54 of the socket assembly 40 more securely and reliably than in the first preferred embodiment of the present invention.

Figure 9:
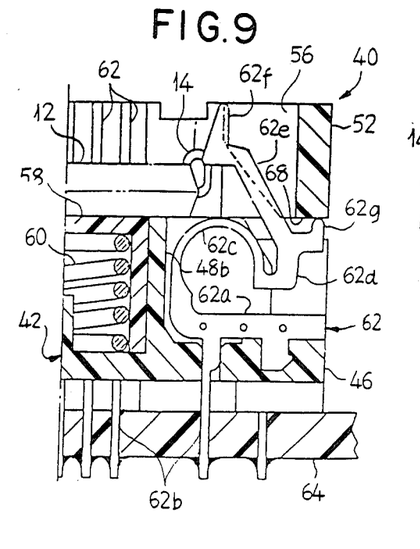
FIG. 9 is a fragmentary sectional view showing a third preferred embodiment of a socket assembly according to the present invention.
Figure 9A:
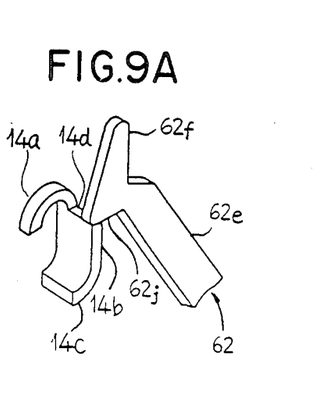
FIG. 9A is a fragmentary perspective view showing portions of the contact element forming part of the embodiment of FIG. 9 in connection with the associated contact pin of the integrated circuit package unit retained in the socket assembly shown in FIG. 9.

In FIG. 9 is shown another modification of the embodiment of FIGS. 3 to 6. The embodiment herein shown is used with an integrated circuit package unit 12 in which each of the contact pins 14 has a portion removed to provide a particular surface portion to be engaged by the associated contact element 62 of the socket assembly 40. As will be better seen from FIG. 9A, each of the contact pins 14 of the integrated circuit package unit 12 has a turning end portion 14a and a stem portion 14b. The turning end portion 14a projects from one end face of the integrated circuit package unit 12 and is arcuately turned in a reverse direction along the side face of the package unit 12. The stem portion 14b of the pin 14 extends in part from the turning end portion 14a and terminates in a leading end portion 14c. The stem portion 14b has a preferably flat end face 14d which extends sidewise of the turning end portion 14a in parallel with the end faces of the integrated circuit package unit 12. The inner lug portion 62f of the contact element 62 to engage such a contact pin 14 has a preferably flat lower abutting surface portion 62j which is engageable with the end face 14d of the stem portion 14b of the pin 14 through surface-to-surface contact therebetween. By reason of the surface-to-surface contact thus provided between the inner lug portion 62f of the contact element 62 and the contact pin 14, the integrated circuit package unit 12 can be retained in position within the housing space 54 of the socket assembly 40 also more securely and reliably than in the first preferred embodiment of the present invention.

Figure 10:
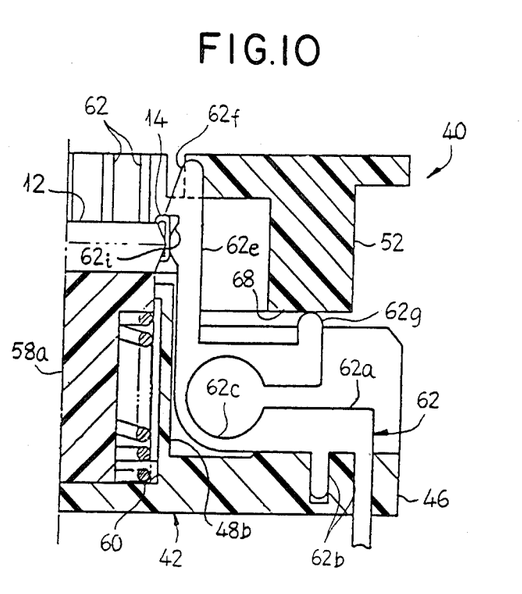
FIG. 10 is a fragmentary sectional view showing a fourth preferred embodiment of a socket assembly according to the present invention.

FIG. 10 shows still another modification of the embodiment of FIGS. 3 to 6. The contact element 62 incorporated in the embodiment herein shown is devoid of the intermediate portion 62d of each contact element 62 in each of the embodiments hereinbefore described. In the embodiment of FIG. 10, furthermore, the curved spring portion 62c is curved through a central angle of 180 degrees or more directly from the seat portion 62a. The outer lug portion 62g extends first outwardly and thereafter upwardly of the support member 42 from a leading end portion of such a spring portion 62c. On the other hand, the elongated arm portion 62e extends straight upwardly from an intermediate portion of the curved spring portion 62c and terminates in the inner lug portion 62f. The inner lug portion 62f of the contact element 62 herein shown is similar in shape to its counterpart in the embodiment of FIG. 8 and is formed with a recess or cutout 62i providing two, upper and lower abutting surface portions which are vertically spaced apart from each other across the recess 62i. The integrated circuit package unit 12 on the carrier member 58 can thus be securely held in position within the housing space 54 vertically by the pressing engagement of the upper abutting surface portion of the lug portion 62f with the associated contact pin 14 and laterally by the pressing engagement with the lower abutting surface portion of the inner lug portion 62f with the pin 14. In FIG. 10, furthermore, the carrier member 58 is shown having a stem portion 58a projecting downwardly into the trough section 48 of the support member and surrounded by the return spring 60.

It will have been understood from the foregoing description that these advantages of a socket assembly according to the present invention results principally from the fact that each of the contact elements 62 provided in the socket assembly essentially has two spring portions, one implemented by the curved spring portion 62c and the other by the elongated arm portion 62e. The geometry of these two spring portions of the contact element are selected in a manner to enable the contact element are selected in a manner to enable the contact element to provide utmost ease in manipulating the socket assembly and enhanced reliability of correctly holding the integrated circuit package unit within the socket assembly. For this purpose, it is preferable that the spring portion implemented by the curved spring portion 62c is shaped to have a relatively small modulus of elasticity while the spring portion implemented by the elongated arm portion 62e is shaped to have a relatively large modulus of elasticity.

While some preferred embodiments of a plug-in socket assembly according to the present invention have thus far been described with reference to the drawings, it should be borne in mind that such embodiments are merely illustrative of the gist of the present invention and are accordingly subject to modification and change. It has been assumed, for example, that each of the contact elements 62 provided in each of the embodiments described in shaped so that the integrated circuit package unit 12 is held in position within the socket assembly principally by the downwardly pressing engagement of the contact element 62 with the associated contact pin 14 of the contact element 12. A socket assembly according to the present invention may however be modified so that each of the contact elements 62 is shaped so that the integrated circuit package unit 12 is held in position within the socket assembly principally by the inwardly or otherwise laterally pressing engagement of the contact element 62 with the associated contact pin 14 of the contact element 12. In this instance, the return spring 60 urging the integrated circuit package unit 12 upwardly of the support member 42 may be dispensed with to simplify the overall construction of the socket assembly. While, furthermore, it has been assumed that the integrated circuit package unit 12 is to be retained in position within the socket assembly by means of the contact elements 62 provided in arrays along the four sides of the socket assembly, the socket assembly may be modified so that the integrated circuit package unit 12 is to be retained in position within the socket assembly by means of the contact elements 62 provided in arrays along the two parallel sides of the socket assembly.

What is claimed is:

1. A plug-in socket assembly for use with a semiconductor integrated circuit package unit having a plurality of contact pins arranged along at least one side of the integrated circuit package unit, the socket assembly having a first direction in which the integrated circuit package unit is to be placed into the socket assembly and a second direction opposite to the first direction, comprising
   (a) a support member,
   (b) a housing member movable toward the support member in said first direction and away from the support member in said second direction, the housing member defining an open space adapted to have said integrated circuit package unit accommodated therein,
   (c) a carrier member for having said integrated circuit package unit detachably supported thereon, the carrier member being mounted on said support member and being movable with respect to each of said support member and said housing member in said first direction into and in said second direction out of a position in which the integrated circuit package unit supported thereon assumes a predetermined position within said open space with respect to said support member.
   (d) a plurality of contact elements supported on said support member and each extending in part in said support member, each of the contact elements having (i) a seat portion disposed on said support member, (ii) a spring portion leading from said seat portion and arcuately curved at least in part away from said open space laterally of the socket assembly, (iii) an elongated arm portion merging out of said spring portion toward said open space laterally of the socket assembly, (iv) an inner lug portion leading from said arm portion and engageable with one of said contact pins of said integrated circuit package unit when the integrated circuit package unit is in said predetermined position within said open space, and (v) an outer lug portion merging out of said arm portion and located outwardly of said inner lug portion laterally of the socket assembly, said housing being formed with a surface portion which is received on said outer lug portions of said contact elements.

2. A socket assembly as set forth in claim 1, in which said arm portion is larger in modulus of elasticity than said spring portion.

3. A socket assembly as set forth in claim 1, in which said arm portion extends toward said open space inwardly of the socket assembly and generally in said second direction and said outer lug portion extends away from said open space inwardly of the socket assembly and at least in part generally in said second direction.

4. A socket assembly as set forth in claim 1, in which said spring portion is substantially circularly curved through a central angle of not less than about 180 degrees between said seat portion and said outer lug portion.

5. A socket assembly as set forth in claim 1, in which each of said contact elements further has an intermediate portion intervening between said spring portion and each of said arm portion and said outer lug portion, said intermediate portion extending in part outwardly from said spring portion laterally of the socket assembly and in part generally in said second direction to said outer lug portion.

6. A socket assembly as set forth in claim 5, in which said spring portion is substantially circularly curved through a central angle of not less than about 180 degrees between said seat portion and said intermediate portion.

7. A socket assembly as set forth in claim 1, in which said arm portion extends substantially in said second direction from an intermediate portion of said spring portion.

8. A socket assembly as set forth in claim 1, further comprising biasing means for urging said carrier member for movement in said second direction with respect to each of said support member and said housing member.

9. A socket assembly as set forth in claim 1, in which said integrated circuit package unit has opposite end faces and each of said contact pins has a turning portion close to one of said end faces and an end portion close to the other of the end faces, said inner lug portion of each of said contact elements being shaped to be closely engageable with each of said turning and end portions of the contact pin.

10. A socket assembly as set forth in claim 1, in which said inner lug portion of each of said contact elements is formed with a recess forming two abutting surface portions which are spaced apart from each other across said recess, one of said abutting surface portions being pressingly engageable with one of the contact pins of said integrated circuit package unit generally in said first direction and the other of said abutting surface portions being pressingly engageable with said one of the contact elements in a lateral direction.

11. A socket assembly as set forth in claim 1, in which each of the contact pins of said integrated circuit package unit has a turning end portion projecting from one end face of the integrated circuit package unit and a stem portion arcuately turned toward the other end face of the integrated circuit package unit, the stem portion having a substantially flat end face extending sidewise of said turning end portion substantially in parallel with the end faces of the integrated circuit package unit, said inner lug portion of each of said contact elements having a substantially flat abutting surface portion engageable with said flat end face of said stem portion.

12. A plug-in socket assembly for use with a semiconductor integrated circuit package unit having a plurality of contact pins arranged along at least one side of the integrated circuit package unit, the socket assembly having a first direction in which the integrated circuit package unit is to be placed into the socket assembly and a second direction opposite to the first direction, comprising
  (a) a support member,
  (b) a housing member movable toward the support member in said first direction and away from the support member in said second direction, the housing member defining an open space adapted to have said integrated circuit package unit accommodated therein,
  (c) a plurality of contact elements supported on said support member and each extending in part in said support member, each of the contact elements having (i) a seat portion disposed on said support member (ii) a spring portion leading from said seat portion and arcuately curved at least in part away from said open space laterally of the socket assembly, (iii) an elongated arm portion merging out of said spring portion toward said open space laterally of the socket assembly, (iv) an inner lug portion leading from said arm portion and engageable with one of said contact pins of said integrated circuit package unit when the integrated circuit package unit is in said open space, and (v) an outer lug portion merging out of said arm portion and located outwardly of said inner lug portion laterally of the socket assembly, said housing being formed with a surface portion which is received on said outer lug portions of said contact elements.

13. A socket assembly as set forth in claim 12, in which said arm portion has a larger modulus of elasticity than said spring portion.

14. A socket assembly as set forth in claim 12, in which said arm portion extends toward said open space inwardly of the socket assembly and generally in said second direction and said outer lug portion extends away from said open space inwardly of the socket assembly and at least in part generally in said second direction.

15. A socket assembly as set forth in claim 12, in which said spring portion is substantially circularly curved through a central angle of not less than about 180 degrees between said seat portion and said outer lug portion.

16. A socket assembly as set forth in claim 12, in which each of said contact elements further has an intermediate portion intervening between said spring portion and each of said arm portion and said outer lug portion, said intermediate portion extending in part outwardly from said spring portion laterally of the socket assembly and in part generally in said second direction to said outer lug portion.

17. A socket assembly as set forth in claim 16, in which said spring portion is substantially circularly curved through a central angle of not less than about 180 degrees between said seat portion and said intermediate portion.

18. A socket assembly as set forth in claim 12, in which said arm portion extends substantially in said second direction from an intermediate portion of said spring portion.

19. A socket assembly as set forth in claim 12, in which said integrated circuit package unit has opposite end faces and each of said contact pins has a turning portion close to one of said end faces and an end portion close to the other of the end faces, said inner lug portion of each of said contact elements being shaped to be closely engageable with each of said turning and end portions of the contact pin.

20. A socket assembly as set forth in claim 12, in which each of the contact pins of said integrated circuit package unit has a turning end portion projecting from one end face of the integrated circuit package unit and a stem portion arcuately turned toward the other end face of the integrated circuit package unit, the stem portion having a substantially flat end face extending sidewise of said turning end portion substantially in parallel with the end faces of the integrated circuit package unit, said inner lug portion of each of said contact elements having a substantially flat abutting surface portion engageable with said flat end face of said stem portion.

* * * * *